(12) United States Patent
Counts et al.

(10) Patent No.: US 10,856,443 B2
(45) Date of Patent: Dec. 1, 2020

(54) CLADDED METAL STRUCTURES FOR DISSIPATION OF HEAT IN A PORTABLE ELECTRONIC DEVICE

(71) Applicant: Apple Inc., Cupertino, CA (US)

(72) Inventors: William A. Counts, Sunnyvale, CA (US); Abhijeet Misra, Sunnyvale, CA (US); Nagarajan Kalyanasundaram, Los Gatos, CA (US); James A. Yurko, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/407,011

(22) Filed: May 8, 2019

(65) Prior Publication Data

US 2019/0380224 A1 Dec. 12, 2019

Related U.S. Application Data

(60) Provisional application No. 62/681,499, filed on Jun. 6, 2018.

(51) Int. Cl.
*H05K 7/20* (2006.01)
*H05K 5/04* (2006.01)

(52) U.S. Cl.
CPC ............. *H05K 7/2039* (2013.01); *H05K 5/04* (2013.01)

(58) Field of Classification Search
CPC ............................... H05K 7/2039; H05K 5/04
See application file for complete search history.

(56) References Cited

U.S. PATENT DOCUMENTS

| | | |
|---|---|---|
| 2,893,931 A | 7/1959 | Boyett |
| 3,173,785 A | 3/1965 | Manganello |
| 3,912,152 A | 10/1975 | Forand |
| 3,958,070 A | 5/1976 | Schintlmeister et al. |

(Continued)

FOREIGN PATENT DOCUMENTS

| | | |
|---|---|---|
| CN | 1962919 A | 5/2007 |
| CN | 101158039 A | 4/2008 |

(Continued)

OTHER PUBLICATIONS

"Heat Dissipation Case," Cooler Master Technology Inc., retrieved on May 18, 2018, <http://www.coolermaster.com/mobile/iphone-series/heat-dissipation-case-traveler-i5a-100/>.

(Continued)

*Primary Examiner* — Binh B Tran
*Assistant Examiner* — Michael A Matey
(74) *Attorney, Agent, or Firm* — Dorsey & Whitney LLP (57) ABSTRACT

This application relates to an enclosure for a portable electronic device is described. The enclosure can include metal bands included along the enclosure and a support structure. The support structure can include a thermally conductive core that is capable of conducting thermal energy generated by the operational components and rails that are bound between the metal bands and the thermally conductive core, where the rails are characterized as having a rate of thermal conductivity that is less than a rate of thermal conductivity of the thermally conductive core so that the thermal energy generated by the operational component is directed away from the operational component and away from the metal bands.

15 Claims, 8 Drawing Sheets

(56) References Cited

U.S. PATENT DOCUMENTS

| | | | |
|---|---|---|---|
| RE29,815 E | 10/1978 | Gnanamuthu | |
| 4,354,301 A | 10/1982 | Takeuchi et al. | |
| 5,167,793 A | 12/1992 | Jozefowicz | |
| 5,305,186 A | 4/1994 | Appelt et al. | |
| 5,396,041 A | 3/1995 | Miller et al. | |
| 6,146,476 A | 11/2000 | Boyer | |
| 6,355,116 B1 | 3/2002 | Chen et al. | |
| 7,408,968 B2 | 8/2008 | Fukuhisa et al. | |
| 7,608,127 B2 | 10/2009 | Lin et al. | |
| 7,760,289 B2 * | 7/2010 | Nakanishi | G06F 1/1616 349/58 |
| 7,967,570 B2 | 6/2011 | Shi et al. | |
| 8,398,841 B2 | 3/2013 | Khosla | |
| 8,733,422 B2 | 5/2014 | Browning et al. | |
| 8,828,553 B2 | 9/2014 | Khosla | |
| 9,127,898 B2 | 9/2015 | Wong | |
| 9,930,785 B2 | 3/2018 | Huang et al. | |
| 9,930,798 B2 | 3/2018 | Browning et al. | |
| 2006/0120054 A1 | 6/2006 | Buschke | |
| 2006/0215371 A1 | 9/2006 | Ishiduka | |
| 2007/0081344 A1 * | 4/2007 | Cappaert | G02B 6/0085 362/373 |
| 2007/0099015 A1 | 5/2007 | Kamo et al. | |
| 2007/0163128 A1 | 7/2007 | Tarrerias | |
| 2008/0037771 A1 * | 2/2008 | Black | H04M 1/0266 379/433.01 |
| 2008/0151503 A1 * | 6/2008 | Aapro | H04M 1/026 361/714 |
| 2009/0035448 A1 | 2/2009 | Flanagan et al. | |
| 2009/0190290 A1 | 7/2009 | Lynch et al. | |
| 2009/0194308 A1 | 8/2009 | Cheng et al. | |
| 2009/0229666 A1 | 9/2009 | Corneille et al. | |
| 2010/0072952 A1 * | 3/2010 | Nakajima | H04B 1/036 320/150 |
| 2010/0086702 A1 | 4/2010 | Blankenship et al. | |
| 2010/0143746 A1 | 6/2010 | Song et al. | |
| 2010/0173172 A1 | 7/2010 | Killian et al. | |
| 2011/0048754 A1 | 3/2011 | Xiong et al. | |
| 2011/0159138 A1 | 6/2011 | Paget et al. | |
| 2012/0044635 A1 | 2/2012 | Rothkopf et al. | |
| 2013/0153429 A1 | 6/2013 | Khosla | |
| 2013/0194782 A1 * | 8/2013 | Byun | H04M 1/02 362/97.1 |
| 2013/0248219 A1 | 9/2013 | Browning et al. | |
| 2013/0271943 A1 * | 10/2013 | Iwai | H05K 9/0007 361/816 |
| 2013/0314875 A1 * | 11/2013 | Jarvis | G06F 1/20 361/712 |
| 2013/0327507 A1 * | 12/2013 | Degner | G06F 1/203 165/120 |
| 2014/0217864 A1 | 8/2014 | Browning et al. | |
| 2014/0262161 A1 * | 9/2014 | Weigand | G06F 1/203 165/104.33 |
| 2014/0347811 A1 | 11/2014 | Yu et al. | |
| 2015/0077909 A1 * | 3/2015 | Filiz | G06F 1/1637 361/679.01 |
| 2016/0135286 A1 * | 5/2016 | Hwang | H05K 1/189 361/720 |
| 2016/0334843 A1 * | 11/2016 | Uto | G02F 1/133385 |
| 2017/0053379 A1 | 2/2017 | Wang et al. | |
| 2017/0055367 A1 | 2/2017 | Shen | |
| 2017/0055379 A1 | 2/2017 | Shen | |
| 2019/0101960 A1 * | 4/2019 | Silvanto | G06F 1/181 |
| 2019/0283365 A1 * | 9/2019 | Mennucci | F28F 21/085 |

FOREIGN PATENT DOCUMENTS

| | | |
|---|---|---|
| CN | 107949240 A | 4/2018 |
| JP | 08502319 A | 3/1996 |
| KR | 20040009306 A | 1/2004 |
| KR | 20110105391 A | 9/2011 |
| TW | 231830 B | 5/2005 |
| WO | 1994008073 A1 | 4/1994 |
| WO | 2005089995 A1 | 9/2005 |
| WO | 2009079745 A1 | 7/2009 |
| WO | 2018009178 A1 | 1/2018 |

OTHER PUBLICATIONS

PCT Patent Application No. PCT/US2013/033378—International Search Report and Written Opinion dated Jul. 9, 2013.
Korean Patent Application No. 10-2014-7029857—Notice of Preliminary Rejection dated Oct. 23, 2015.
Chinese Patent Application No. 201380016683.3—First Office Action dated Nov. 4, 2015.
Taiwanese Patent Application No. 102110535—Office Action dated Jul. 17, 2015.
Chinese Patent Application No. 201380016683.3—Second Office Action dated Jun. 29, 2016.
Weast, Robert C., "Handbook of Chemistry and Physics", 1969, CRC, 50th Ed., F-18.
European Patent Application No. 19176560.1—Extended European Search Report dated Sep. 27, 2019.

* cited by examiner

CLADDED METAL STRUCTURES FOR DISSIPATION OF HEAT IN A PORTABLE ELECTRONIC DEVICE

CROSS-REFERENCE TO RELATED APPLICATIONS

The present application claims the benefit of U.S. Provisional Application No. 62/681,499, entitled "CLADDED METAL STRUCTURES FOR DISSIPATION OF HEAT IN A PORTABLE ELECTRONIC DEVICE," filed Jun. 6, 2018, which is incorporated by reference herein in its entirety for all purposes.

FIELD

The described embodiments relate generally to cladded metal structures for portable electronic devices. More particularly, the described embodiments relate to a support structure that includes a core and cladded metal structures for dissipating thermal energy generated by operational components of a portable electronic device.

BACKGROUND

Recent technological advances have enabled manufacturers in the portable electronic device industry to integrate a large number of operational components (e.g., processors, antennas, displays, haptic feedback components, etc.) in a small cavity of a single enclosure of a portable electronic device. However, because of the small cavity and the types of materials utilized in the enclosure (e.g., glass, ceramic, etc.), there is an excessive amount of heating within the portable electronic device. Consequently, operation of the portable electronic device can suffer due to the excessive amount of heating. For example, over-heating within the cavity of the portable electronic device can lead to premature failure of certain operational components. Accordingly, there is a need for the enclosure to include structures that are capable of effectively dissipating the heat generated by these operational components.

SUMMARY

This paper describes various embodiments that relate generally to cladded metal structures for portable electronic devices. More particularly, the described embodiments relate to a support structure that includes a core and cladded metal structures for dissipating thermal energy generated by operational components of a portable electronic device.

According to some embodiments, an enclosure for a portable electronic device is described. The enclosure can include metal bands carried by a sidewall of the enclosure. The enclosure can further include a support structure, where the support structure can include a thermally conductive core that is thermally coupled to an operational component that is capable of generating heat, where the thermally conductive core is formed of a first material that is capable of conducting at least some of the heat away from the operational component as a heat flow along a first heat flow path. Furthermore, the support structure can include rails that mechanically couple the metal bands to an edge of the thermally conductive core, wherein the rails are formed of a second material that causes at least some of the heat flow of the first heat flow path to follow a second heat flow path that is generally parallel to the sidewall of the enclosure.

According to some embodiments, an enclosure for a portable electronic device is described. The enclosure can be capable of carrying an operational component that is capable of generating thermal energy. The enclosure can include metal bands arranged along peripheral surfaces of the enclosure and a thermally conductive core that is thermally coupled to the operational component, where the thermally conductive core is capable of conducting the thermal energy away from the operational component. The enclosure can further include rails that laterally border the thermally conductive core, where a shape of the rails defines a directional path by which the thermal energy is conducted away from the operational component.

According to some embodiments, an enclosure for a portable electronic device is described. The enclosure can include a stiffening plate that is capable of supporting operational components that are capable of generating thermal energy. The stiffening plate can include a thermal core that accommodates a first operational component and a second operational component. The stiffening plate can further include rails that are arranged at a periphery of the thermal core, where the rails are characterized as having a shape that defines a thermal pathway of the thermal core such that the thermal energy generated by the first operational component bypasses the second operational component while being directed through the thermal core.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein relate generally to support structures for portable electronic devices. In particular, the support structures can refer to support plates, stiffening plates, mid-plates, cladded metal structures, and the like that are capable of dissipating thermal energy generated by operational components of a portable electronic device. As described herein, the term dissipation can refer to the transformation of mechanical energy into energy dissipation. The term thermal dissipation can also be referred to as thermal conduction.

Although recent technological advances have enabled portable electronic device manufacturers to fit a large combination of different operational components (e.g., processor, antenna, sensor, etc.) within a single enclosure, these portable electronic devices are often subject to over-heating due to the large amount of heat that is generated by each of these operational components. Further problematic, the over-heating of these portable electronic devices can often be perceived by a user. For example, heat generated by these operational components is absorbed by the sides of the enclosure where a user's fingers are placed to support the portable electronic device. Furthermore, enclosures that include metals to function as heat sinks may also be undesirable in that these enclosures are capable of generating an excessive amount of heat during operation that is unpleasant to the user's touch.

Further complicating matters is that conventional portable electronic devices include enclosures or housings that are formed of materials that are relatively ineffective thermal conductors, such as glass or ceramic. Indeed, many conventional portable electronic devices carry operational components such as wireless charging coils for inductive charging. In order for the wireless charging coils to receive an electromagnetic field, the amount of metal included within the enclosure should be minimized. However, non-metal materials such as glass or relatively inefficient at dissipating thermal energy away from the operational component.

To cure the aforementioned deficiencies, the systems and techniques described herein relate to support structures for carrying these operational components. In particular, the support structures include a thermally conductive core and a set of rails that are formed of a material that has a lower rate of thermal conductivity than the thermally conductive core. In this manner, the thermal energy generated by the operational component is drawn away by the thermally conductive core without being absorbed by the sides of the enclosure. Beneficially, user discomfort due to over-heating within the portable electronic device is prevented and/or minimized.

According to some embodiments, an enclosure for a portable electronic device is described. The enclosure can include metal bands carried by a sidewall of the enclosure. The enclosure can further include a support structure, where the support structure can include a thermally conductive core that is thermally coupled to an operational component that is capable of generating heat, where the thermally conductive core is formed of a first material that is capable of conducting at least some of the heat away from the operational component as a heat flow along a first heat flow path. Furthermore, the support structure can include rails that mechanically couple the metal bands to an edge of the thermally conductive core, wherein the rails are formed of a second material that causes at least some of the heat flow of the first heat flow path to follow a second heat flow path that is generally parallel to the sidewall of the enclosure.

These and other embodiments are discussed below with reference to FIGS. 1-7; however, those skilled in the art will readily appreciate that the detailed description given herein with respect to these figures is for explanatory purposes only and should not be construed as limiting.

Figure 1A:
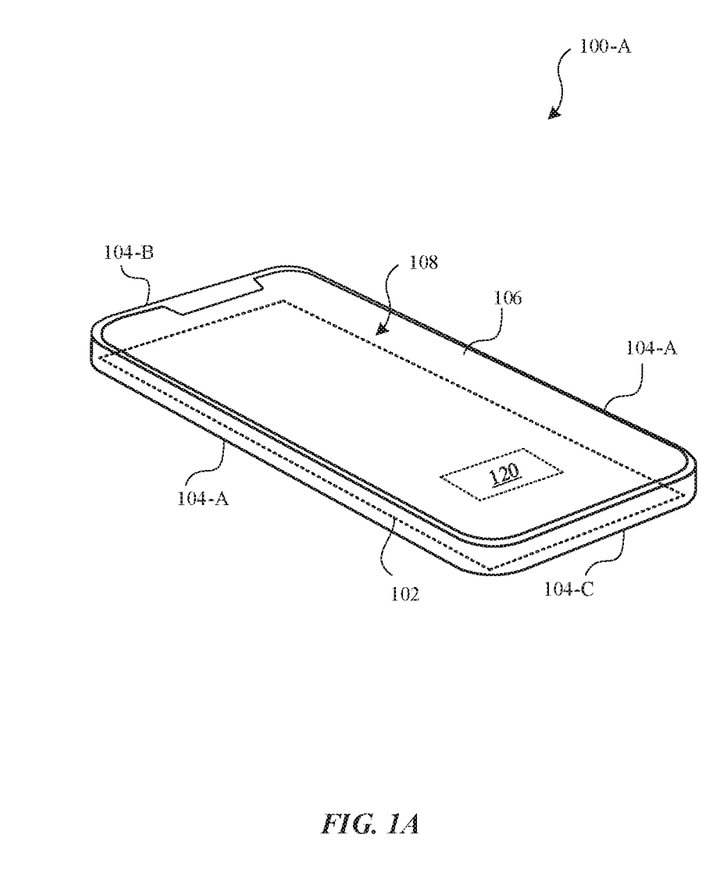
FIGS. 1A-1B illustrate various views of portable electronic devices that includes a support structure having cladded metal structures, in accordance with some embodiments.
Figure 1B:
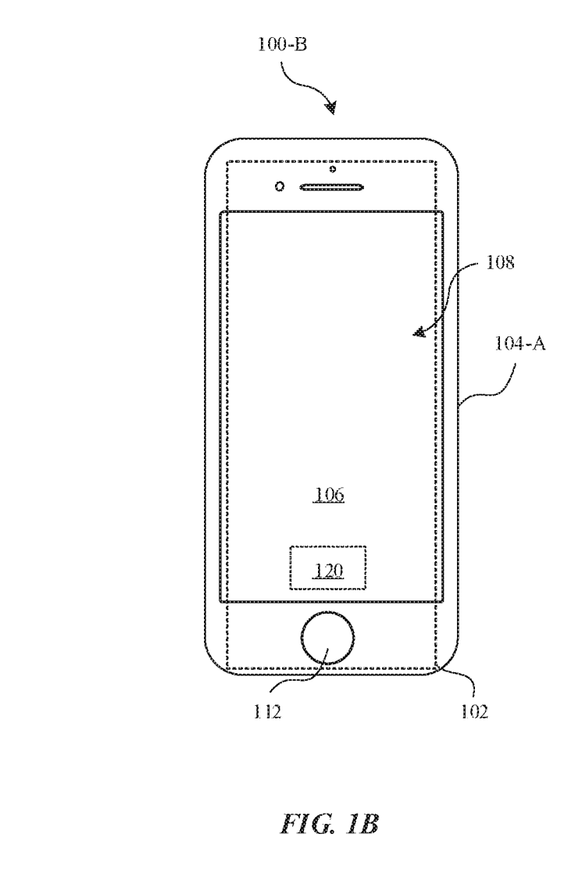

FIGS. 1A-1B illustrate portable electronic devices that are capable of including support structures, in accordance with various embodiments. In particular, the techniques as described herein can be used to form support structures that are capable of supporting one or more operational components within a cavity of an enclosure for a portable electronic device. According to some examples, the portable electronic device can refer to a portable computing device, a smartphone, a laptop, a smartwatch, a fitness tracker, a mobile phone, a wearable consumer device, and the like. It should also be noted that the enclosure can also be referred to as a housing. In some embodiments, the support structures described herein can also be referred to as support plates, mid-plates, cladded structures or stiffening plates.

FIGS. 1A-1B illustrate portable electronic devices 100-A and 100-B that both include an enclosure 104 having walls that defines a cavity 108 and the enclosure 104 carries a display assembly 106 and an operational component 120. In particular, the enclosure 104 includes sides 104-A, a top 104-B, and a bottom 104-C. It should be noted that when a user holds the portable electronic device 100-A, the sides 104-A are more likely to be held by the user's hands than the top 104-B and the bottom 104-C.

FIG. 1A illustrates that the portable electronic device 100-A includes a display assembly 106 that covers a majority of a top surface of the enclosure 104. The display assembly 106 can include a capacitive unit and/or a force detection unit that is capable of detecting an input at the display assembly 106 and presenting a corresponding graphical output at the display assembly 106. Furthermore, FIG. 1B illustrates that the portable electronic device 100-B includes a button 112 that is disposed below the display assembly 106. The button 112 is capable of providing a control signal to the operational component 120 that causes the operational component 120 to execute a function.

FIGS. 1A-1B illustrate that the portable electronic devices 100-A and 100-B include a support structure 102 that is capable of carrying the operational component 120. The support structure 102 can be disposed within the cavity 108 and also secured to the enclosure 104. The support structure 102 can be secured to the enclosure 104. For example, the support structure 102 can be secured to the enclosure 104 via a weld, a clad, an adhesive, and the like. More particularly, the support structure 102 is secured to walls (or sidewalls) of the enclosure 104.

In some examples, the operational component 120 can include a circuit board, a processor, an antenna, a display, a haptic feedback module, a camera, a sensor, and the like. Additionally, in some examples, the operational component 120 can include inductive charging or wireless charging coils, such as magnetic cores that include ferrites. It should be noted that in order for a magnetic field to pass through the enclosure 104 to reach the wireless charging coils, the enclosure 104 should preferably be comprised of non-metal material (e.g., glass, etc.). Beneficially, the non-metal material can enable a magnetic flux to be absorbed by the wireless charging coils.

It should be noted that the operational component 120 can generate a large amount of thermal energy, e.g., between about 60 W-100 W of thermal energy. Indeed, circuits and processors are capable of generating a large amount of thermal energy due to constant switching of transistors. Because the operational component 120 can generate a large amount of thermal energy (e.g., heat, etc.), the enclosure 104, such as the sides 104-A can absorb a significant amount of the thermal energy which can render a feeling of discomfort when a user handles the portable electronic device 100-A. According to the various embodiments described herein, the term thermal energy can also refer to heat In particular, the amount of the thermal energy that is absorbed by the enclosure 104 is further exacerbated by the materials of the enclosure 104. In particular, the materials of the enclosure 104 may have a low rate of thermal conductivity. For example, the enclosure 104 can include one or more types of materials such as metal, polymers, glass, ceramic, and the like. In some examples, the metal can include at least one of a steel alloy, aluminum, aluminum alloy, titanium, zirconium, magnesium, copper, and the like. In some examples, the enclosure can include a metal oxide layer that is formed from a metal substrate.

According to some examples, the enclosure 104, such as at least one of the sidewalls, back wall, front face, and the like, can include a non-metal material. The use of the non-metal material can reduce the amount of electromagnetic interference of the enclosure 104, especially with regard to antenna signals. The operational component 120, such as a wireless transceiver, is capable of wirelessly receiving and transmitting data signals with other electronic devices. Beneficially, an enclosure 104 having a non-metal material, such as glass, is generally non-electrically conductive (i.e., dielectric) and is configured to allow the data signals to be received and/or transmitted.

As will be described herein, while glass is beneficial in enabling the data signals and magnetic field to pass through the enclosure 104, glass is also more fragile and susceptible to cracking, breaking, or deforming than metals when the enclosure 104 is subject to an impact. Consequently, it may be difficult to secure the operational component 120 to the enclosure. However, the support structure 102 can be capable of securing the operational component 120 within the cavity 108.

Figure 2A:
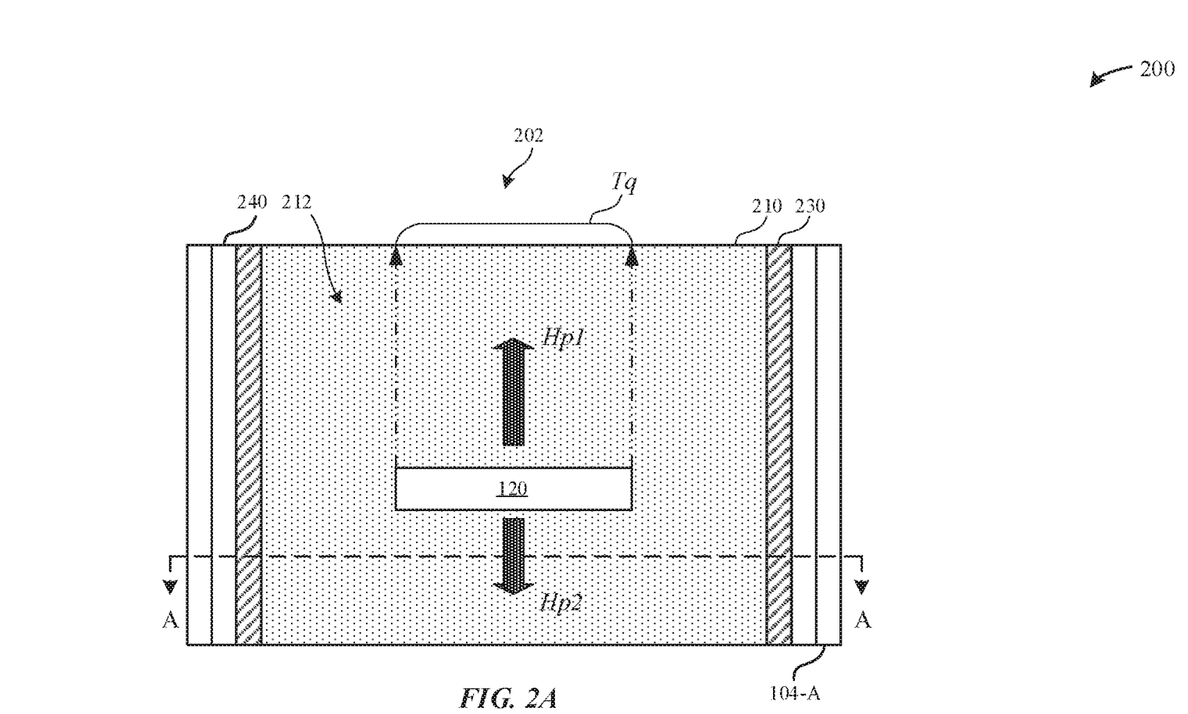
FIGS. 2A-2C illustrate various views of a portable electronic device that includes a support structure having cladded metal structures, in accordance with some embodiments.
Figure 2B:
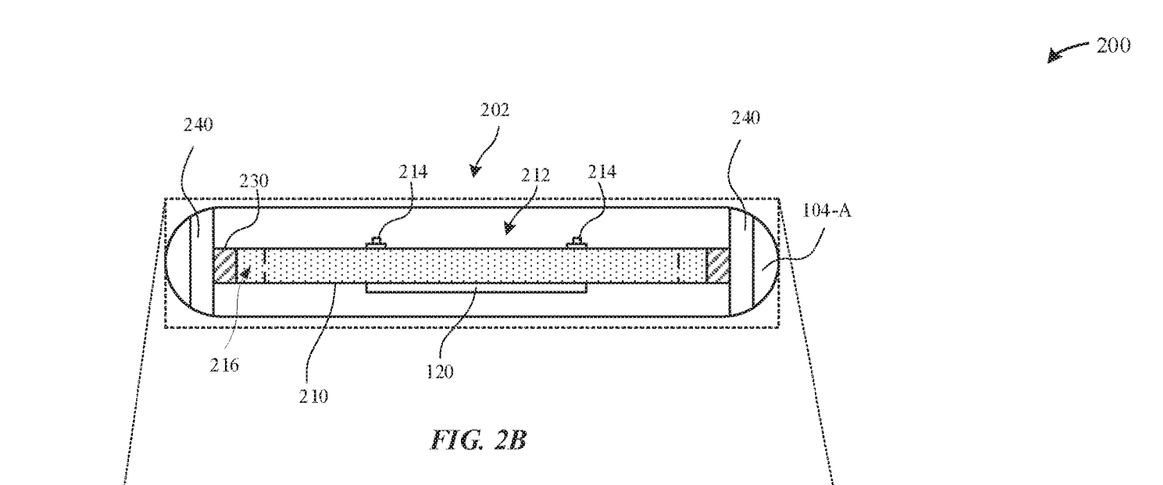
Figure 2C:
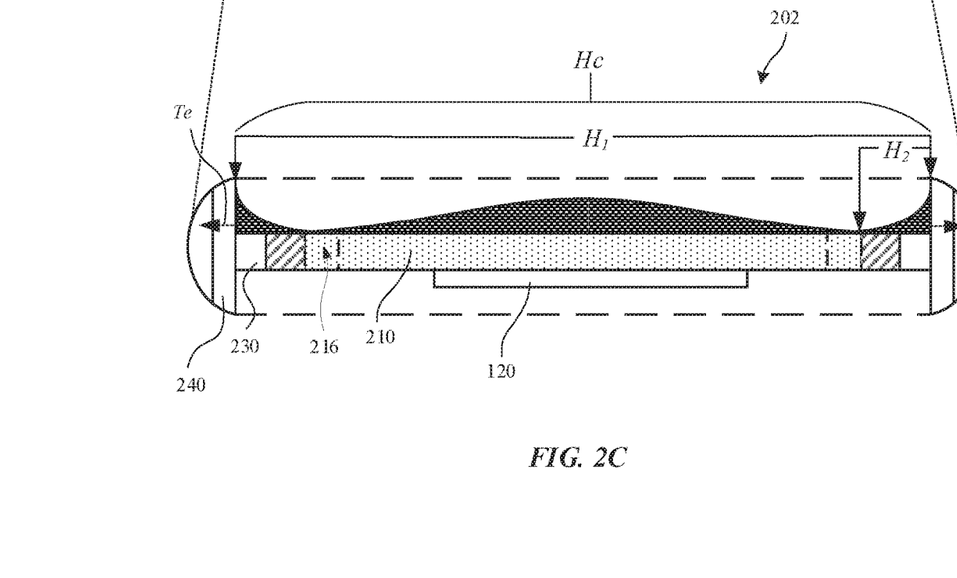

FIGS. 2A-2C illustrate various views of a support structure for a portable electronic device 200, in accordance with some embodiments. In some examples, the support structure 202 can correspond to the support structure 102 as illustrated in FIGS. 1A-1B. As will be described herein, the support structure 202 is capable of dissipating thermal energy (e.g., heat) generated by the operational component 120.

As shown in the top view of the support structure 202 illustrated in FIG. 2A, the support structure 202 includes a thermally conductive core 210. The thermally conductive core 210 is characterized as having a high thermal conductivity that enables the thermally conductive core 210 to transfer heat at a higher rate than materials having a low thermal conductivity.

As illustrated in FIGS. 2A-2C, the thermally conductive core 210 is capable of drawing thermal energy (Tq) away from the operational component 120. Additionally, it is also beneficial to draw the thermal energy away from the sides 104-A of the enclosure. As described herein, the sides 104-A of the enclosure are most likely to be supported by the user's hand. Accordingly, the support structure 202 should be capable of drawing thermal energy away from the operational component 120 and away from the sides 104-A such as to avoid causing discomfort to the user's hand.

At least one solution for circumventing the aforementioned problem is to incorporate a set of rails 230 that correspond to the sides 104-A of the enclosure. The set of rails 230 can be laterally bound between the thermally conductive core 210 and metal bands 240. In some examples, the set of rails 230 are coupled to an edge of the thermally conductive core 210. In some examples, the set of rails 230 are formed at heat affected zones along edges of the thermally conductive core 210. In some examples, the metal bands 240 are secured to the sides 104-A of the enclosure (e.g., welded, cladded, adhesive, fused, cold spray deposition, etc.). The set of rails 230 can mechanically couple the metal bands 240 and the thermally conductive core. 210. In particular, the set of rails 230 are capable of promoting heat dissipation/conduction along a thermal pathway that corresponds to a length of the thermally conductive core 210 (i.e., between the top 104-B and the bottom 104-C of the enclosure). In order to promote heat dissipation/conduction along the length of the thermally conductive core 210, the set of rails 230 are characterized as having a rate of thermal conductivity that is less than the thermally conductive core 210. According to some embodiments, the set of rails 230 can function as a thermal barrier that prevents the thermal energy (Tq) from being absorbed by the sides 104-A of the enclosure. In other words, the thermally conductive core 210 functions as a thermal bridge when surrounded by the set of rails 230. The thermal bridge creates a thermal path of least resistance for heat transfer from the operational component 120. Beneficially, the set of rails 230 promote thermal dissipation of the thermal energy (Tq) along the length of the thermally conductive core 210 and in a direction that corresponds to a shape of the set of rails 230. In some examples, as illustrated in FIGS. 2A, the thermal dissipation of the thermal energy (Tq) is parallel to a shape of the set of rails 230, which are shown as being generally elongated and parallel to each other. In some embodiments, the shape and/or orientation of the set of rails 230 can define the direction and/or shape of heat dissipation from the operational component 120 by the thermally conductive core 210. In some examples, the set of rails 230 are comprised of a metal, such as stainless steel. In some examples, the set of rails 230 are formed of a polymer.

As illustrated in FIG. 2A, the dissipation of the thermal energy (Tq) by the thermally conductive core 210 is more heavily concentrated about a midline of the thermally conductive core 210 relative to peripheral edges of the thermally conductive core 210. As shown in FIG. 2A, the heat flow paths (Hp1, Hp2) are generally parallel to the set of rails 230 and/or the sides 104-A of the enclosure such that substantially most of the thermal energy does not dissipate to the set of rails 230. The heat flow paths (Hp1, Hp2) are in generally opposing directions away from the operational component 120. The heat flow paths (Hp1, Hp2) are based on a thermal gradient established by at least the thermally conductive core 210 and the set of rails 230. Beneficially, the set of rails 230 avoid drawing a majority or generally all of the thermal energy (Tq) towards the sides 104-A of the enclosure such as to prevent user discomfort. Instead the set of rails 230 are configured to beneficially direct at least a majority of the thermal energy (Tq) towards the top 104-B and /or the bottom 104-C of the enclosure 104, which correspond to portions of the enclosure 104 that are less likely to be held by the user.

According to some embodiments, the sides 104-A of the enclosure, such as sidewalls, are secured to metal bands 240. In some examples, the metal bands 240 are arranged to increase an amount of rigidity to the enclosure, as well as securely hold the support structure 202 in place relative to the enclosure. As will be described in greater detail herein, the set of rails 230 can be cladded to the metal bands 240 such that the support structure 202 is held securely in place.

In some examples, the thermally conductive core 210 has a thickness between about 50 micrometers to about 500 micrometers. In some examples, the thermally conductive core 210 has a thickness between about 50 micrometers to about 150 micrometers. In some examples, the thermally conductive core 210 has a width between about 20 millimeters to about 100 millimeters. In other examples, the thermally conductive core 210 has a width between about 40 millimeters to about 80 millimeters.

In some examples, the set of rails 230 have a width between about 5 millimeters to about 20 millimeters. In some examples, the set of rails 230 have a thickness between about 50 micrometers to about 500 micrometers. In some examples, the support structure 202 have a thickness that is generally equivalent to a thickness of the thermally conductive core 210. In some examples, the support structure 202 includes a planar weldable surface 212. The planar weldable surface 212 is capable of receiving one or more fasteners 214 for securing the operational component 120 to the thermally conductive core 210.

FIG. 2B illustrates a cross-sectional view of the support structure 202 taken along the A-A reference line of the support structure 202 illustrated in FIG. 2A, in accordance with some embodiments. As illustrated in FIG. 2B, the set of rails 230 are cladded to the thermally conductive core 210 at heat affected zones 216. The heat affected zones 216 can represent where cladding material (e.g., stainless steel, etc.) and the metal substrate (e.g., copper, copper alloy, etc.) melt and mix together to form a metallurgical bond. In some examples, the heat affected zone 216 can be characterized as having a high degree of mixing between the cladding material and the metal substrate. In some examples, the set of rails 230 are formed by a laser cladding process.

As illustrated in FIG. 2A-2C, the set of rails 230 are welded to metal bands 240 of the enclosure 104. In this manner, the metal bands 240 are mechanically and thermally coupled to the thermally conductive core 210. Beneficially, the metal bands 240 being thermally coupled to the thermally conductive core 210 minimizes an amount of thermal resistance along a midline of the thermally conductive core 210. The metal bands 240 are secured directly to the sides 104-A of the enclosure. In some embodiments, the metal bands 240 are formed of a material that is similar or equivalent to the set of rails 230 such as to increase the ease by which the set of rails 230 are welded to the metal bands 240. For example, both the metal bands 240 and the set of rails 230 are formed of stainless steel. Since the set of rails 230 are also formed of stainless steel, the set of rails 230 can be easily weld to the metal bands 240. Beneficially, the ease of welding the set of rails 230 to the metal bands 240 facilitate in securing and affixing the support structure 202 to the sides 104-A of the enclosure.

In some examples, the thermally conductive core 210 includes pure copper or a copper alloy. While pure copper has a thermal conductivity of about 401 W/m that may be beneficial in readily dissipating heat away from operational component 120, pure copper is also relatively soft and susceptible to deformation. Consequently, a support structure 202 that is formed of pure copper may suffer from a lack of rigidity, especially when the portable electronic device 200 is subject to drops. Consequently, the operational component 120 can become dislodged from the lack of rigidity provided by the support structure 202. Accordingly, to address the aforementioned problem, the operational component 120 may be secured to the support structure 202 via at least one fastener 214. Additionally, the support structure 202 can include one or more rigidity-promoting layers that stiffen/render the thermally conductive core 210 more rigid in order to secure the operational component 120 to the support structure 202, as described with reference to the stiffness-inducing layers 320 and 420 of FIGS. 3-4, respectively. Other examples of materials for the thermally conductive core 210 include materials with a high rate of thermal conductivity such as aluminum, gold, graphite, iron, and the like.

FIG. 2B illustrates attachment features 214 that extend through a weldable surface 212 of the thermally conductive core 210. The attachment features 214 can secure the operational component 120 to the thermally conductive core 210. These attachment features 214 can include nuts, bolts, screws, welds, an adhesive, and the like. In some examples, fasteners or nuts are welded directly to the weldable surface 212. In particular, where the attachment features 214 extend through the weldable surface 212, the thermally conductive core 210 can be comprised of a copper alloy. In some examples, the copper alloy includes an alloying element such as zirconium or tin that can be used to strengthen the thermally conductive core 210 such as to allow the attachment features 214 to be securely fixed to the thermally conductive core 210. Although it should be noted that a minimal amount of the alloying element in the copper alloy should be present in order to maintain the thermally conductive properties of the thermally conductive core 210.

FIG. 2C illustrates an exploded view of the support structure 202 as shown in FIG. 2B in conjunction with thermal energy being conducted away from the operational component 120, in accordance with some embodiments. In particular, FIG. 2C illustrates a heat curve (Hc) of the amount of heat that flows along the heat flow path (Hp) relative to the set of rails 230. In some examples, the set of rails 230 are configured to inhibit the conduction of thermal energy through the set of rails 230 and to the metal bands 240 such that heat is insulated within the set of rails 230. In other examples, the set of rails 230 are also configured to generally inhibit and /or minimize the conduction of the thermal energy to the metal bands 240. In other examples, FIG. 2C illustrates that some of the thermal energy that reaches the set of rails 230 bows against the set of rails 230 in a manner that is generally parallel to the set of rails 230.

In addition, in some examples, and as illustrated by FIG. 2C, some of a minute quantity of the thermal energy (Te) may pass through the set of rails 230 and reach the metal bands 240. However, it should be noted that this minute quantity of thermal energy (Te) is not sufficient to heat the sides 104-A of the enclosure so as to cause user discomfort and is a result of the thermal gradient of the support structure 202.

In some embodiments, the heat is conducted away from the operational component 120 via a heat flow path. As illustrated in FIG. 2C, at least some of the heat is conducted as a heat flow along a first heat flow path ($H_1$). In particular, the first heat flow path ($H_1$) generally corresponds to the thermally conductive core 210. In another example first heat flow path ($H_1$) generally corresponds to the support structure 202. FIG. 2C illustrates that at least some of the heat flow of the first heat flow path ($H_1$) follows along a second heat flow path ($H_2$). In particular, the second heat flow path ($H_2$) is characterized as having an overall lower temperature than the first heat flow path ($H_1$) due to a lesser amount of heat that is conducted by way of the second heat flow path ($H_2$) than the first heat flow path ($H_1$). The second heat flow path ($H_2$) bows against the set of rails 230 and/or the metal bands 240 and is generally contoured to the set of rails 230. The second heat flow path ($H_2$) flows in a direction that is generally parallel to the sides 104-A of the enclosure. In some examples, the difference in material between the thermally conductive core 210 and the set of rails 230 defines a thermal gradient that generates the first and second heat flow paths ($H_{1, 2}$). In some examples, the first heat flow path ($H_1$) follows a direction that is generally similar or generally opposite to the second heat flow path ($H_2$).

In particular, the heat flow path (Hp) and the heat curve (Hc) are based on a thermal gradient of the support structure 202, which can be represented as K/m. The heat curve (Hc) is generally represented by a Gaussian curve as shown in FIG. 2C. As illustrated in FIG. 2C, the dissipation of heat is more heavily concentrated about a midline of the thermally conductive core 210 relative to peripheral edges of the thermally conductive core 210. Beneficially, this thermal gradient focuses the majority of the heat between the set of rails 230. More specifically, the majority of the heat is focused along the thermally conductive core 210 rather than the set of rails 230 and/or the metal bands 240. Furthermore, it should be noted that the embodiments as described herein with reference to FIG. 2C also apply to any one of the support structures 202, 302, 402, 502, 602-A or 602-B as described herein.

Figure 3A:
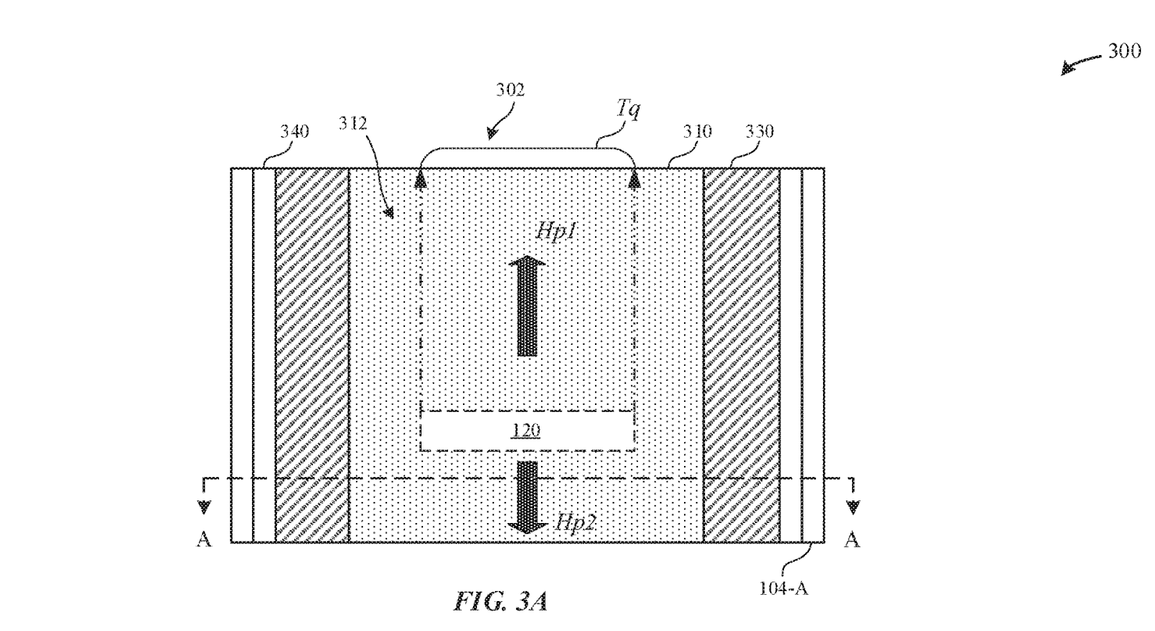
FIGS. 3A-3B illustrate various views of a support structure having cladded metal structures, in accordance with some embodiments.
Figure 3B:
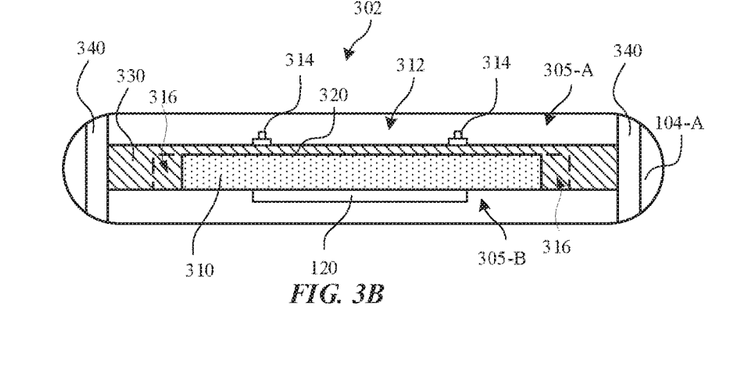

FIGS. 3A-3B illustrate various views of a support structure for a portable electronic device 300, in accordance with some embodiments. In some examples, the support structure 302 can correspond to the support structure 102 as illustrated in FIGS. 1A-1B. As will be described herein, the support structure 302 is capable of dissipating thermal energy (e.g., heat) generated by the operational component 120.

As shown in the top view of the support structure 302 illustrated in FIG. 3A, the support structure 302 includes a thermally conductive core 310. The thermally conductive core 310 is capable of drawing thermal energy (Tq) away from the operational component 120. Additionally, as illustrated in FIG. 3A, the thermally conductive core 310 is laterally bound by a set of rails 330.

In some examples, the set of rails 330 are coupled to an edge of the thermally conductive core 310. In some examples, the set of rails 330 are formed at heat affected zones along edges of the thermally conductive core 310. The set of rails 330 mechanically and thermally couple metal bands 340 and the thermally conductive core 310. The set of rails 330 are characterized as having a thermal rate of conductivity that is less than the thermally conductive core 310. The set of rails 30 are capable of promoting heat dissipation along a thermal pathway that corresponds to a length of the thermally conductive core 310 (i.e., between the top 104-B and the bottom 104-C of the enclosure). The set of rails 330 can function as a thermal barrier that prevents the thermal energy (Tq) from being absorbed by the sides 104-A of the enclosure while the thermally conductive core 310 functions as a thermal bridge when surrounded by the set of rails 330. In particular, the thermal bridge creates a thermal path of least resistance for heat transfer from the operational component 120. Similar to the set of rails 230 of the support structure 202 illustrated in FIGS. 2A-2B, the set of rails 330 concentrates the dissipation of the thermal energy (Tq) more heavily about a midline of the thermally conductive core 310 relative to peripheral edges of the thermally conductive core 310.

FIG. 3A illustrates that the heat flow paths (Hpl, Hp2) are in generally opposing directions away from the operational component 120. The heat flow paths (Hp1, Hp2) are based on a thermal gradient established by at least the thermally conductive core 310 and the set of rails 330. As shown in FIG. 3A, the heat flow path is generally parallel to the set of rails 330 and/or the sides 104-A of the enclosure such that substantially most of the thermal energy does not dissipate to the set of rails 330.

According to some embodiments, the sides 104-A of the enclosure, such as sidewalls, are secured to metal bands 340. In some examples, the set of rails 330 can be cladded to the metal bands 340 such that the support structure 302 is held securely in place.

FIG. 3B illustrates a cross-sectional view of the support structure 302 taken from the A-A reference line. The thermally conductive core 310 is laterally bound by a set of rails 330 that are cladded to the thermally conductive core 310 at heat affected zones 316. The set of rails 330 can be welded to metal bands 340 of the sides 104-A of the enclosure.

It should be noted that the support structure 302 of FIGS. 3A-3B can include one or more features of the support structure 202 illustrated in FIGS. 2A-2B. However, in contrast to the support structure 202 illustrated in FIGS. 2A-2B, the support structure 302 includes a stiffness-inducing layer 320. The stiffness-inducing layer is capable of increasing an amount of bending stiffness to the support structure 302. In particular, the stiffness-inducing layer 320 is cladded or welded to a top surface of the thermally conductive core 310. For instance, the stiffness-inducing layer 320 includes a weldable surface 312 that is capable of receiving attachment features 314 to extend to the thermally conductive core 310.

In some examples, the stiffness-inducing layer 320 is comprised of stainless steel. Because the stiffness-inducing layer 320 is formed of stainless steel, the stiffness-inducing layer 320 is characterized as a having a lower rate of thermal conductivity than the thermally conductive core 310. Beneficially, the thermal energy (Tq) generated by the operational component 120 is not absorbed by the stiffness-inducing layer 320. In other words, the combination of the set of rails 330 and the stiffness-inducing layer 320 can function as a thermal barrier that prevents the thermal energy (Tq) from being absorbed by the sides 104-A of the enclosure and an upper surface 305-A of the enclosure while the thermally conductive core 310 functions as a thermal bridge when surrounded by the set of rails 330 and the stiffness-inducing layer 320. In particular, the thermal bridge creates a thermal path of least resistance for heat transfer from the operational component 120. As a result, the support structure 302 causes the thermal energy (Tq) to be dissipated towards a top 104-B of the enclosure and a lower surface 305-B of the enclosure.

In some embodiments, the set of rails 330 are integrally formed with the stiffness-inducing layer 320. In other embodiments, the set of rails 330 are separately formed from the stiffness-inducing layer 320. In other words, the set of rails 330 and the stiffness-inducing layer 320 are concurrently formed around the thermally conductive core 310. In some examples, the set of rails 330 and the stiffness-inducing layer 420 include a common material.

In some embodiments, the set of rails 330 laterally bound the thermally conductive core 310. In particular, the set of rails 330 can be cladded to the thermally conductive core 310 at heat affected zones 316. Furthermore, the set of rails 330 can be joined to the metal bands 340 via a weld, clad, cold spray deposition, adhesive, or other process.

Figure 4A:
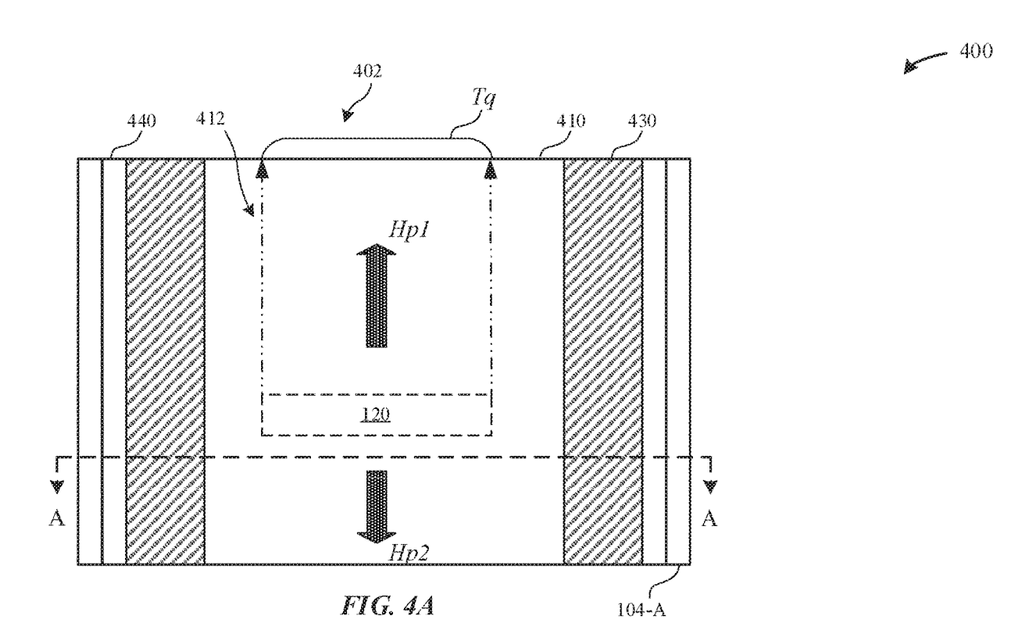
FIGS. 4A-4B illustrate various views of a support structure having cladded metal structures, in accordance with some embodiments.
Figure 4B:
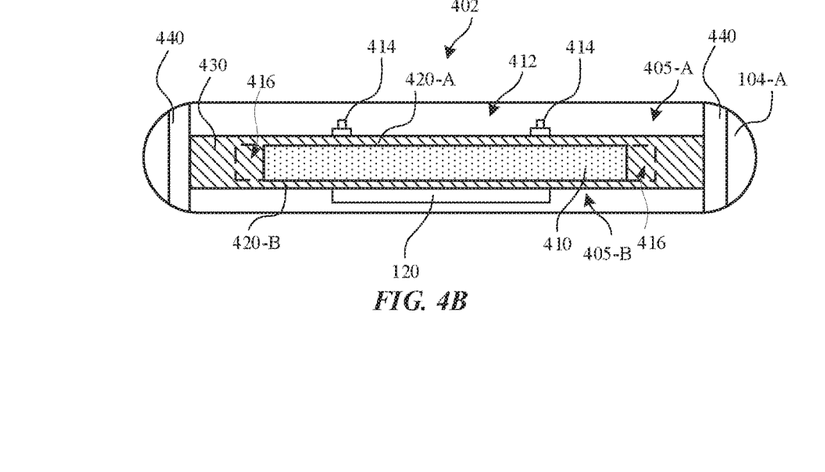

FIGS. 4A-4B illustrate various views of a support structure for a portable electronic device 400, in accordance with some embodiments. In some examples, the support structure 402 can correspond to the support structure 102 as illustrated in FIGS. 1A-1B. As will be described herein, the support structure 402 is capable of dissipating thermal energy (e.g., heat) generated by the operational component 120.

As shown in the top view of the support structure 402 illustrated in FIG. 4A, the support structure 402 includes a thermally conductive core 410. The thermally conductive core 410 is capable of drawing thermal energy (Tq) away from the operational component 120. The thermally conductive core 410 is laterally bound by a set of rails 430. In some examples, the set of rails 430 are coupled to an edge of the thermally conductive core 410. In some examples, the set of rails 430 are formed at heat affected zones along edges of the thermally conductive core 410. The set of rails 430 are characterized as having a thermal rate of conductivity that is less than the thermally conductive core 310. Accordingly, the set of rails 430 can function as a thermal barrier that prevents the thermal energy (Tq) from being absorbed by the sides 104-A of the enclosure while the thermally conductive core 410 functions as a thermal bridge when surrounded by the set of rails 430. In particular, the thermal bridge creates a thermal path of least resistance for heat transfer from the operational component 120. Similar to the set of rails 230 of the support structure 202 illustrated in FIGS. 2A-2B, the set of rails 430 concentrates the dissipation of the thermal energy (Tq) more heavily about a midline of the thermally conductive core 410 relative to peripheral edges of the thermally conductive core 410. According to some embodiments, the support structure 402 is secured to the sides 104-A of the enclosure, such as sidewalls, via metal bands 440. In some examples, the set of rails 430 are cladded to the metal bands 440 such that the support structure 402 is held firmly in place. The set of rails 430 mechanically and thermally couple the metal bands 440 and the thermally conductive core 410.

As shown in FIG. 4A, the heat flow path is generally parallel to the set of rails 430 and/or the sides 104-A of the enclosure such that substantially most of the thermal energy does not dissipate to the set of rails 430. The heat flow paths (Hp1, Hp2) are in generally opposing directions away from the operational component 120. The heat flow paths (Hp1, Hp2) are based on a thermal gradient established by at least the thermally conductive core 410 and the set of rails 430.

FIG. 4B illustrates a cross-sectional view of the support structure 402 taken from the A-A reference line. The thermally conductive core 410 is laterally bound by a set of rails 430 that are cladded to the thermally conductive core 410 at heat affected zones 416. The set of rails 430 are welded to metal bands 440 of the sides 104-A of the enclosure.

It should be noted that the support structure 402 of FIGS. 4A-4B can include one or more features of the support structure 202 illustrated in FIG. 2A-2B or the support structure 302 illustrated in FIGS. 3A-3B. However, in contrast to the support structure 302 illustrated in FIGS. 3A-3B, the support structure 402 includes multiple stiffness-inducing layers. In particular, the support structure 402 includes an upper stiffness-inducing layer 420-A and a lower stiffness-inducing layer 420-B. These stiffness-inducing layers 420-A, B can be joined to the thermally conductive core 410 (e.g., cladding, etc.). Additionally, these stiffness-inducing layers 420-A, B can be formed of stainless steel in order to increase rigidity of the support structure 402. In some examples, the stiffness-inducing layers 420-A, B can include a weldable surface 412 that is capable of receiving one or more attachment features 414 that extend to the thermally conductive core 410 for attaching the operational component 120 to the thermally conductive core 410.

In some examples, the stiffness-inducing layer 420 is comprised of stainless steel. Because the stiffness-inducing layer 420 is formed of stainless steel, the stiffness-inducing layer 420 is characterized as a having a lower rate of thermal conductivity than the thermally conductive core 410. In some examples, the combination of the set of rails 430 and the stiffness-inducing layer 420 can function as a thermal barrier that prevents the thermal energy (Tq) from being absorbed by the sides 104-A of the enclosure, the upper surface 405-A of the enclosure, and the lower surface 405-B of the enclosure. As a result, the support structure 402 causes the thermal energy (Tq) to be dissipated generally towards a top 104-B of the enclosure.

In some embodiments, the upper stiffness-inducing layer 420-A includes a weldable surface 412 that enables attachment features 414 to extend to the thermally conductive core 410 for the purpose of securing operational component 120 to the thermally conductive core 410. It should be noted that by incorporating multiple stiffness-inducing layers 420-A, B, the support structure 402 can be characterized as having a greater amount of stiffness than the support structure 302.

Figure 5A:
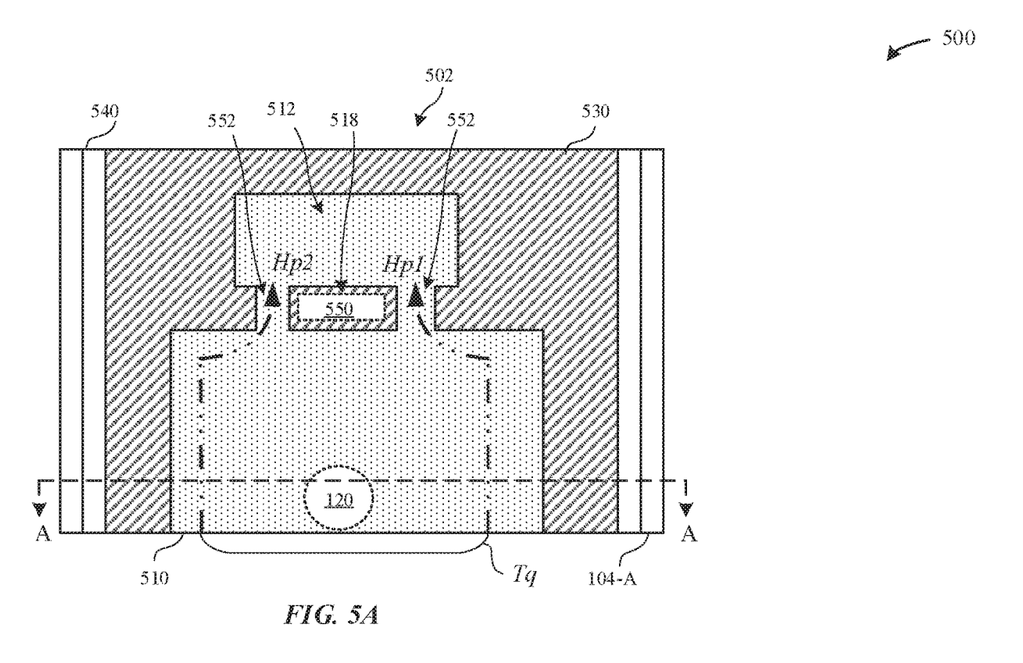
FIGS. 5A-5B illustrate various views of a support structure having cladded metal structures, in accordance with some embodiments.
Figure 5B:
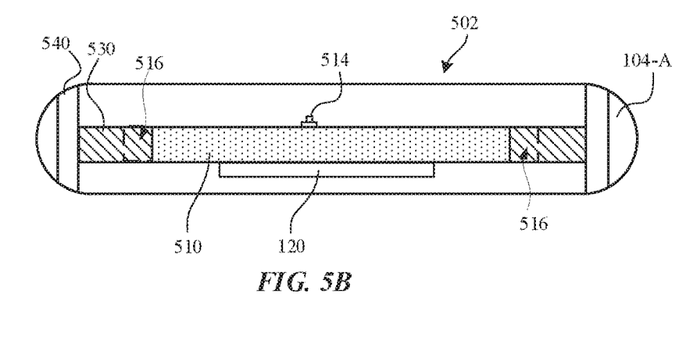

FIGS. 5A-5B illustrate various views of a support structure for a portable electronic device 500, in accordance with some embodiments. In some examples, the support structure 502 can correspond to the support structure 102 as illustrated in FIGS. 1A-1B. As will be described herein, the support structure 502 is capable of dissipating thermal energy (e.g., heat) generated by the operational component 120.

FIG. 5A illustrates a top view of the support structure 502. The support structure 502 can include a support layer 530 that is welded to metal bands 540 of the sides 104-A of the enclosure. In some examples, the support layer 530 includes a sheet of stainless steel that includes one or more apertures 518. In some examples, these apertures 518 can be formed via at least one of a stamping, machining, etching, or pressing process. The apertures 518 can be subsequently filled with a material, such as pure copper or a copper alloy, in order to form a thermally conductive core 510. In some examples, the thermally conductive core 510 is cladded to the support layer 530. In particular, the thermally conductive core 510 dissipates thermal energy generated by an operational component 120. The thermally conductive core 510 includes a weldable surface 512 for receiving one or more fasteners 514, as illustrated by FIG. 5B. The thermally conductive core 510 may be laterally bound by rails 532 of the support layer 530 that are cladded to the thermally conductive core 510 at heat affected zones 516.

In some embodiments, the apertures 518 have a shape/geometry that accommodates for an electronic component 550. In some examples, the electronic component 550 can refer to a circuit board, a processor, an antenna, a display, a haptic feedback module, a camera module, a sensor, and the like.

In some embodiments, the thermally conductive core 510 includes conductive traces 552 that bypass the electronic component 550 so as to prevent the thermal energy (Tq) generated by the operational component 120 from being absorbed by the electronic component 550. Instead the conductive traces 552 facilitate the thermal energy (Tq) to be redirected to the top 104-B of the enclosure. As illustrated in FIGS. 5A-5B, the thermally conductive core 510 is laterally bound by a set of rails 532 of the support layer 530 that are characterized as having a thermal rate of conductivity that is less than the thermally conductive core 510. The set of rails 532 of the support layer 530 are capable of promoting heat dissipation along heat paths (Hp1, Hp2) that correspond to a shape/size of the set of rails 532 of the support layer 530 and the length of the thermally conductive core 510 (i.e., between the top 104-B and the bottom 104-C of the enclosure). Similar to the set of rails 230 of the support structure 202 illustrated in FIGS. 2A-2B, the set of rails 532 of the support layer 530 concentrates the dissipation of the thermal energy (Tq) along the heat paths (Hp1, Hp2) more heavily about a midline of the thermally conductive core 310 relative to peripheral edges of the thermally conductive core 510. As shown in FIG. 5A, the heat flow path is generally parallel to the set of rails 532 and/or the sides 104-A of the enclosure such that substantially most of the thermal energy does not dissipate to the set of rails 532 of the support layer 530. In some examples, the set of rails 532 are formed of stainless steel. It should be noted that the shape of the set of rails 532 of the support layer 530 is variable and can generally define a thermal path by which the thermal energy (Tq) passes through the thermally conductive core 510.

FIG. 5B illustrates a cross-sectional view of the support structure 502 illustrated in FIG. 5A taken from the A-A reference line. The support layer 530 includes a set of rails 532 that are metallurgically bonded to the thermally conductive core 510. In some examples, the thermally conductive core 510 is cladded to the set of rails 532. Additionally, the set of rails 532 can be welded to metal bands 540 of the sides 104-A of the enclosure, such as the sidewalls. In some instances, the set of rails 532 and the metal bands 540 include a common metal, such as stainless steel, that promotes welding of the support structure 502 to the enclosure 104. The set of rails 532 mechanically and thermally couple the metal bands 540 and the thermally conductive core 510.

Figures 6A, 6B:
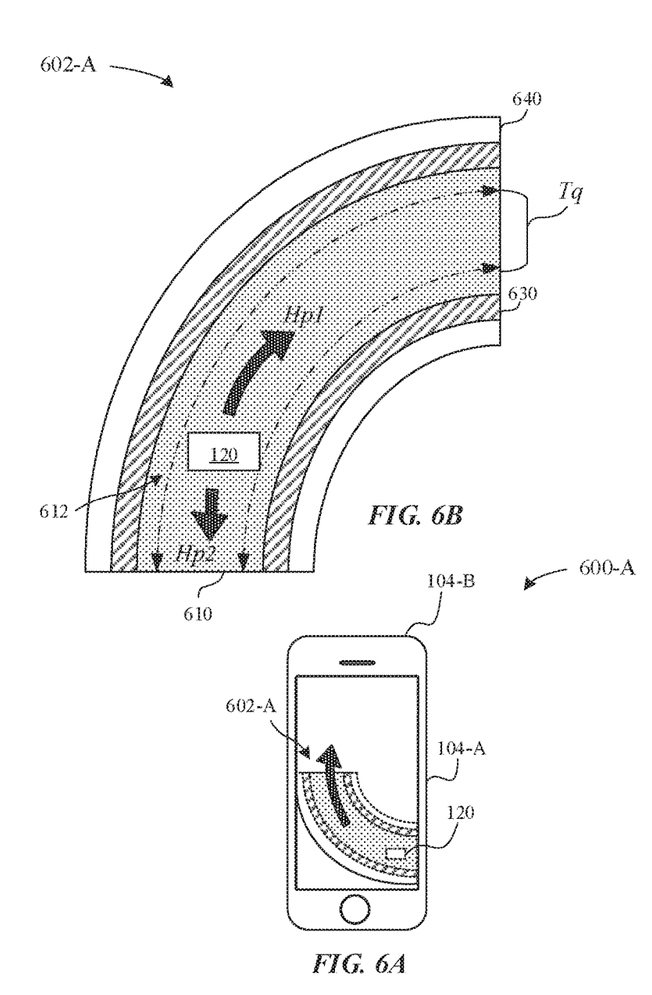
FIGS. 6A-6D illustrate support structures having cladded metal structures, in accordance with some embodiments.

FIGS. 6A-6D illustrate support structures having cladded metal structures, in accordance with some embodiments. FIGS. 6A-6B illustrate an embodiment of a portable electronic device 600-A that includes a support structure 602-A. In contrast to the foregoing support structures as described herein, the support structure 602-A includes a set of rails 630 having a curved shape. The set of rails 630 are joined to metal bands 640, where the metal bands 640 are joined to sides 104-A of the enclosure.

As shown in the top view of the support structure 602-A illustrated in FIG. 6B, the support structure 602-A includes a thermally conductive core 610. The thermally conductive core 610 is capable of drawing thermal energy (Tq) away from the operational component 120. The thermally conductive core 610 is laterally bound by a set of rails 630 that are characterized as having a thermal rate of conductivity that is less than the thermally conductive core 610. The set of rails 630 concentrate the dissipation of the thermal energy (Tq) more heavily about a midline of the thermally conductive core 610 relative to peripheral edges of the thermally conductive core 610. In some examples, the dissipation of the thermal energy (Tq) is generally balanced relative to the set of rails 630. As illustrated in FIG. 6B, the curved shape orientation of the set of rails 630 can define the direction and/or shape of thermal energy (Tq) from the operational component 120 by the thermally conductive core 610. In some examples, the set of rails 630 are joined to the thermally conductive core 610 via a cladding process at heat affected zones. In some examples, the set of rails 630 are joined to the thermally conductive core 610 via a weld or other attachment feature.

In some examples, the set of rails 630 function as a thermal barrier that prevents the thermal energy (Tq) from being absorbed by the sides 104-A of the enclosure and the bottom 104-C of the enclosure. Instead the thermally conductive core 610 functions as a thermal bridge when surrounded by the set of rails 630. In particular, the thermal bridge creates a thermal path of least resistance for heat transfer from the operational component 120. As a result, the support structure 602-A causes the thermal energy (Tq) to be dissipated towards a top 104-B of the enclosure.

Figure 6C:
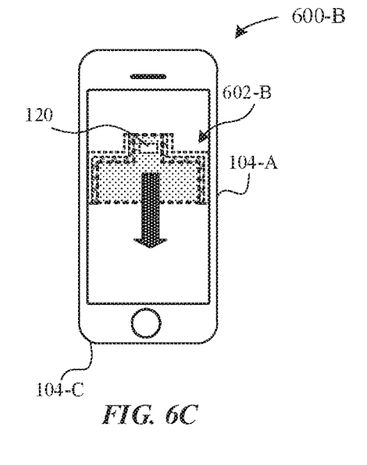
Figure 6D:
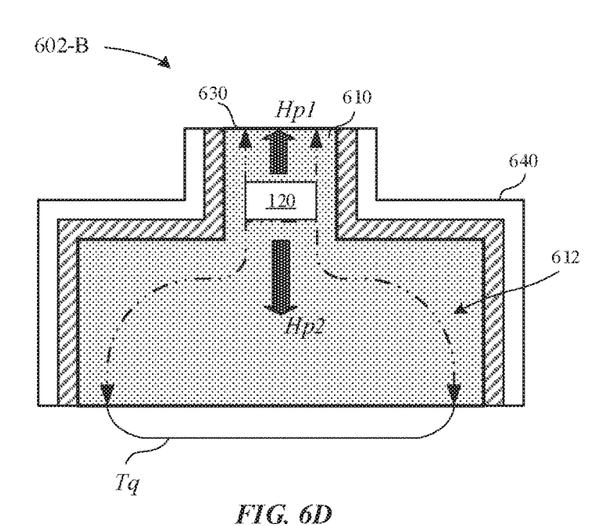

FIGS. 6C-6D illustrate an embodiment of a portable electronic device 600-B that includes a support structure 602-B. In contrast to the foregoing support structures as described herein, the support structure 602-B includes a set of rails 630 having a rectilinear shape, where the set of rails 630 expand away from the operational component 120. The set of rails 630 function as a thermal barrier that prevents the thermal energy (Tq) from being absorbed by the sides 104-A of the enclosure. Instead the thermally conductive core 610 functions as a thermal bridge when surrounded by the set of rails 630. In particular, the thermal bridge creates a thermal path of least resistance for heat transfer from the operational component 120. As a result, the support structure 602-B causes the thermal energy (Tq) to be dissipated towards a bottom 104-C of the enclosure.

The support structures 602-A and 602-B can include a weldable surface 612 for receiving one or more fasteners, as illustrated by FIGS. 6B and 6D.

The following description applies to any one of the support structures 202, 302, 402, 502, 602-A, or 602-B as described herein, and by way of example, is described with reference to the support structure 202 of FIGS. 2A-2C. The thermally conductive core 210 and the set of rails 230 can be formed of at least one common material or the thermally conductive core 210 and the set of rails 230 can be formed of one or more different materials. In particular, if the support structure 202 that includes the thermally conductive core 210 and the set of rails 230 are formed of one or more of the same materials, then the support structure 202 may define a thermal gradient based on an amount of the same material. In one example, the thermally conductive core 210 and the set of rails 230 can include only the common material. However, the thermally conductive core 210 may include an amount of the common material that is greater than an amount of the common material that is included in the set of rails 230. Since the thermally conductive core 210 include a greater amount of the common material than the set of rails 230, then the set of rails 230 are less capable of acting as a thermal conductor to conduct heat away from the operational component 120 than the thermally conductive core 210.

In another example, the thermally conductive core 210 and the set of rails 230 may also include an equal amount of the common material. However, due to a shape and/or size of the thermally conductive core 210, the thermally conductive core 210 is more capable of conducting the heat away from the operational component 120 than the set of rails 230. For instance, if the thermally conductive core 210 is larger than the set of rails 230, then the thermally conductive core 210 provides a larger surface area than the set of rails 230 that is capable of dissipating heating than the set of rails 230.

In another example, the metal bands 240 and the set of rails 230 include one or more common materials. In one instance, the metal bands 240 can be comprised of a material that is less thermally conductive than a material of the set of rails 230 such that the metal bands 240 also define a thermal barrier that prevents heat that is conducted away from the operational component 120 from being conducted to the metal bands 240.

In another example, if the set of rails 230 in aggregate define a larger surface area than the thermally conductive core 210, the set of rails 230 can define a thermal barrier as long as the set of rails 230 are formed of material that is less thermally conductive than a material of the thermally conductive core 210.

According to some embodiments, any one of the support structures 202, 302, 402, 502, 602-A, or 602-B as described herein can utilize an active heat exchanger, such as a fan, in order to increase an amount of air flow through the thermally conductive core. The active heat exchanger can minimize recirculation of warm air within the cavity of the portable electronic device; thereby, reducing a temperature of the support structure. It should be noted that air flow through any one of these support structures is important to transferring the thermal energy (i.e., heat) to the set of rails and the metal bands.

Figure 7:
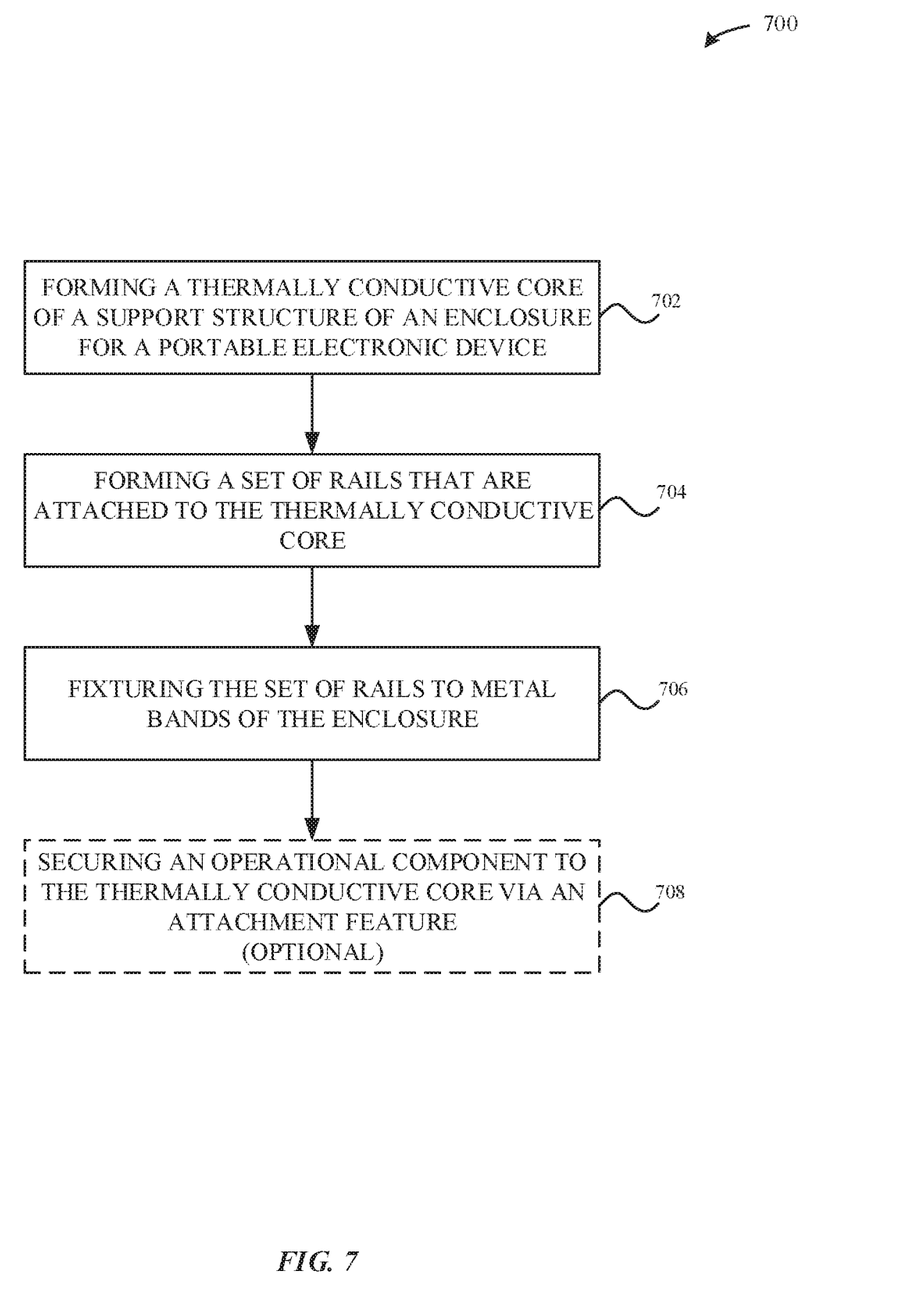
FIG. 7 illustrates a flowchart for forming a support structure for a portable electronic device that includes cladded metal structures, in accordance with some embodiments.

FIG. 7 illustrates a flow diagram of a method 700 for forming a support structure for an enclosure for a portable electronic device, in accordance with some embodiments. As illustrated in FIG. 7, the method 700 begins at step 702 by forming a thermally conductive core for the support structure. For example, the method 700 is described with reference to FIGS. 2A-2B, where the thermally conductive core 210 of the support structure 202 is formed. Although it should be noted that the method can describe forming any one of the support structures 102, 202, 302, 402, 502, 602-A, or 602-B as described herein.

At step 704, the method 700 includes forming a set of rails 230 that are attached to the thermally conductive core 210. In some examples, the set of rails 230 are cladded, welded or fused to the thermally conductive core 210.

At step 706, the method 700 includes fixturing the set of rails 230 to metal bands 240 of the enclosure 104. In some examples, the set of rails 230 are formed via one of a cladding, welding, fusing, or cold spray deposition process.

At step 708, the method 700 optionally includes securing an operational component 120 to the thermally conductive core 210 via an attachment feature 214.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An enclosure for a portable electronic device, the enclosure comprising:
   a metal band secured to a sidewall of the enclosure; and
   a support structure, comprising:
      a thermally conductive core configured to be in thermal communication with an operational component, the thermally conductive core comprising a first material;
      a first metal layer overlying a first surface of the thermally conductive core, and a second metal layer overlying a second surface of the thermally conductive core opposite the first surface, the first metal layer and the second metal layer clad to the thermally conductive core at, a heat affected zone;
      a set of fasteners that extend through the first metal layer and through the thermally conductive core; and
      a rail directly coupled to the metal band and the thermally conductive core, the rail comprising a second material that is metallic and that is less thermally conductive than the first material.

2. The enclosure of claim 1, wherein the second material comprises stainless steel.

3. The enclosure of claim 1, further comprising glass, the glass having a lower thermal conductivity than the first material and the metallic second material.

4. The enclosure of claim 1, wherein the metal band comprises a material of the same composition as the second material.

5. The enclosure of claim 1, wherein the thermally conductive core comprises at least one of copper or a copper alloy, and the first metal layer comprises stainless steel.

6. The enclosure of claim 1, wherein the thermally conductive core defines a first heat flow path directed away from the operational component in a direction that is perpendicular to the sidewall, and a second heat flow path directed away from the operational component in a direction parallel to the sidewall.

7. An enclosure for a portable electronic device, the enclosure capable of carrying an operational component, the enclosure comprising:
   metal bands defining peripheral surfaces of the enclosure;
   a thermally conductive core configured to be in thermal communication with the operational component;
   a first metal layer overlying a first surface of the thermally conductive core, and a second metal layer overlying a second surface of the thermally conductive core opposite the first surface, the first metal layer and the second metal layer clad to the thermally conductive core at a heat affected zone;
   a set of fasteners that extend through the first metal layer; and
   rails that laterally border the thermally conductive core, a shape of the rails defining a directional thermal conduction path away from the operational component.

8. The enclosure of claim 7, wherein a thermal conductivity of the rails is less than a thermal conductivity of the thermally conductive core.

9. The enclosure of claim 7, wherein the thermally conductive core comprises copper or a copper alloy.

10. The enclosure of claim 7, wherein the rails are mechanically and thermally coupled to the metal bands.

11. The enclosure of claim 7, wherein the thermally conductive core defines an opening sized to accommodate the operational component.

12. An enclosure for a portable electronic device, the enclosure comprising:
   a stiffening plate configured to carry an operational component, the stiffening plate comprising:
   a thermal core configured to be in thermal communication with the operational component;
   a first metal layer overlying a first surface of the thermal core, and a second metal layer overlying a second surface of the thermal core opposite the first surface, the first metal layer and the second metal layer clad to the thermal core at a heat affected zone;
   a set of fasteners that extend through the first metal layer and are configured to affix the operational component to the thermal core; and
   rails coupled to a periphery of the thermal core;
   the stiffening plate configured to preferentially conduct thermal energy away from the operational component in a direction parallel to the rails.

13. The enclosure of claim 12, further comprising glass, the glass having a thermal conductivity that is less than a thermal conductivity of the thermal core.

14. The enclosure of claim 12, wherein the rails comprise stainless steel.

15. The enclosure of claim 12, wherein the thermal core comprises copper or a copper alloy.

\* \* \* \* \*